United States Patent
Yamamoto et al.

[11] Patent Number: 5,899,140
[45] Date of Patent: May 4, 1999

[54] BUMP LEVELLING METHOD AND BUMP LEVELLING APPARATUS

[75] Inventors: Akihiro Yamamoto, Kobe; Makoto Imanishi; Takahiro Yonezawa, both of Neyagawa; Shinzo Eguchi, Kyotanabe; Osamu Nakao, Osaka, all of Japan

[73] Assignee: Matsushita Electric Industrial Co., Ltd., Japan

[21] Appl. No.: 08/985,204

[22] Filed: Dec. 4, 1997

[30] Foreign Application Priority Data

Dec. 5, 1996 [JP] Japan ................................. 8-324479

[51] Int. Cl.⁶ ...................... B30B 15/14; H01L 21/60
[52] U.S. Cl. .................... 100/35; 100/48; 100/99; 100/229 R; 100/231; 257/737; 257/778
[58] Field of Search ...................... 100/35, 48, 99, 100/229 R, 231, 258 A, 289; 264/293; 257/737, 785, 778; 29/825, 829

[56] References Cited

U.S. PATENT DOCUMENTS 4,784,058 11/1988 Nakagawa et al. .................. 100/35

*Primary Examiner*—Stephen F. Gerrity
*Attorney, Agent, or Firm*—Parkhurst & Wendel, L.L.P.

[57] ABSTRACT

A bump leveling method and a bump leveling apparatus in which the leveled height of bumps can be made constant and meet the change in thickness of an IC chip. A pressing force under which one bump is deformed to a prescribed height is measured. Thus, the pressing force under which a plurality of bumps can be deformed and leveled can be set. A load cell detects that a prescribed pressing force is exerted on the bumps and this pressing force is maintained, so that the plurality of bumps can be leveled up to the same prescribed height.

9 Claims, 3 Drawing Sheets

BUMP LEVELLING METHOD AND BUMP LEVELLING APPARATUS

FIELD OF THE INVENTION

The present invention relates to a bump leveling method and a bump leveling apparatus for levelling bumps formed on the electrode of an IC chip for a flip chip bonding.

BACKGROUND OF THE INVENTION

In recent years, packaging an IC chip on a circuit substrate has used flip chip bonding, so that the distance to connect an inner electrode on the IC chip and an outer electrode on the circuit substrate could be decreased. Flip chip bonding has been carried out in order to improve the noise resistance of the IC as the frequency increases.

A process for manufacturing electrode including forming protrusion electrodes (generally, called bumps) through which the inner electrode of the IC chip is connected to the outer electrode on the circuit substrate on the IC chip. A bump leveling apparatus has been employed conventionally so as to level uniformly a plurality of bumps formed on the electrode of the IC chip so that they are the same height.

A conventional bump leveling method and a bump leveling apparatus are illustrated in FIG. 3A. According to the bump leveling method shown in FIG. 3A, spacers are held between a stage and a leveler depending upon the thickness of the IC chip and the height of the bumps after they are leveled. The distance between the stage and the leveler is maintained to a prescribed distance, so that the bumps are leveled to a prescribed height.

Conventional bump leveling methods and bump apparatuses will be described hereinafter with reference to the drawings.

FIG. 3A is a schematic cross-sectional view showing a construction of a conventional bump leveling apparatus. In FIG. 3A, stage 1 holds an IC chip 2. A spacer 3 allows a leveler 4 to level only the height of bumps 5.

An operation of the bump level apparatus as mentioned above will be described below.

When the bumps 5 are respectively formed with an uneven height, leveling is required so that they have the same height. The leveler 4 is moved downward toward the direction (as shown in FIG. 3A) by a pressing means (not illustrated). When the leveler 4 is held by the spacers 3 provided between the stage 1 and the leveler 4 to retain a prescribed distance from the stage 1, the tip ends 5a of the bumps 5 respectively having uneven height are made flat, as shown in FIG. 3B, and a plurality of bumps 5 are leveled so as to have the same prescribed height.

FIG. 3B shows the form of one bump after a plurality of bumps are leveled. In FIG. 3B, b designates a pedestal diameter, c designates a leveled diameter, d designates the thickness of a pedestal, and e represents the overall height of the bump. IC chip 2 has an inner electrode 6, and pedestal 7 is on top, covering a portion of the electrode. After the bumps are leveled to a prescribed as previously mentioned, the pedestal diameter b, the leveled diameter c, the thickness d of the pedestal, the overall height e of the bump and the misregistration or positional deviation between the inner electrode 6 of the IC chip 2 and the pedestal 7 are all visually examined. This allows for detection of defective bumps 5.

However, problems in the above conventional bump leveling apparatus have occurred that a plurality of spacers 3 need to be maintained, and these spacers 3 must be replaced by new spacers so as to meet the individually measured thickness of the IC chips in order to locate and maintain the accuracy in the overall height of the bumps 5 within a range of ±2 μm in the IC chips 2 that have thickness between lots within a range of ±10 μm. In this connection, when the height of the bumps 5 is varied to obtain a plurality of bump height, there has arisen a problem that further additional spacers 3 must be retained.

Since it takes a long time for a leveling process, the time required for examining the pedestal thickness d or the overall height e of the bump 5 allows only for a small sampling inspection.

Disclosure of the Invention

The present invention was made to overcome the above-mentioned problems and it is an object of the present invention to provide a bump leveling method and a bump leveling apparatus in which the overall height of bumps can be changed based on the thickness of the IC chips even when the thickness of the IC chips changes depending on spaces between the lots of the IC chips or the kinds thereof and in which the forms of the leveled bumps can automatically undergo a 100% inspection.

For achieving the above-stated object, according to one aspect of the present invention, there are provided the bump leveling method and the bump leveling apparatus in which a pressing force under which one bump can be deformed to a prescribed height is measured, so that a prescribed pressing force under which a plurality of bumps can be simultaneously deformed and leveled to the prescribed height can be set, and then, while the prescribed pressing force is continuously exerted on a leveler, the bumps can be leveled to the prescribed height.

Further, according to another aspect of the present invention, there are provided the bump leveling method and the bump leveling apparatus in which the height of the upper surface of the IC chip is previously measured and the leveler is stopped and held at a position higher by the overall height of each of the bumps than the upper surface of the IC chip so that the bumps can be leveled to the prescribed height.

Still further, according to another aspect of the present invention, there are provided a bump leveling method and a bump leveling apparatus in which the height of the upper surface of the IC chip and the difference of height between the respective parts of each of the bumps are measured after the bumps are leveled to the prescribed height, and the dimensions and the positions of the respective parts of each of the bumps are automatically inspected.

As stated above, according to the present invention, even when the thickness of the chip changes depending on the spaces between the lots of the IC chips or the kinds of the IC chips, the overall height of each of the bumps can be varied based on the thickness of the IC chips, and the forms of the leveled bumps can be automatically totally inspected.

Specifically stated, one embodiment of the bump leveling apparatus comprises: a stage for holding the IC chip leveler; a leveler opposed to and in parallel with the stage through the IC chip held on the stage; and a pressing member for generating a pressing force to the leveler, the pressing member being constructed so as to maintain the pressing force to the leveler to a prescribed pressing force under which a plurality of bumps are simultaneously leveled to a prescribed height.

The bump leveling apparatus according to another embodiment further comprises a pressure detecting member for detecting the pressing force of the pressing member to the leveler arranged between the pressing member and the leveler, the pressing member being designed so as to maintain the detected value of the pressure detecting member to the prescribed pressing force.

The bump leveling apparatus in another embodiment for leveling bumps formed on the electrode of an IC chip for a flip chip bonding comprises: a stage for holding the IC chip; a leveler opposed to and in parallel with the stage through the IC chip held on the stage; and a pressing member for generating a pressing force to the leveler, the pressing member being designed so as to stop a pressing operation to the leveler when the leveler comes to a position higher by the overall height of the bump than the upper surface of the IC chip. The bump leveling apparatus in another embodiment further comprises a height measuring member for measuring the height of the upper surface of the IC chip, the pressing member being designed so as to stop its pressing operation to the leveler when the leveler comes to a position higher by the overall height of the bump than the measured value of the height measuring member.

The bump leveling apparatus in another embodiment is characterized in that the height measuring member is designed to automatically inspect a height, a leveled diameter, a pedestal diameter and an amount of positional deviation of the bump after the bumps are leveled.

The bump leveling apparatus in another embodiment further comprises a measuring member for inspecting the height, the leveled diameter, the pedestal diameter and the amount of positional deviation of the bump, as inspection items, the measuring member being designed to automatically inspect the inspection items after the bumps are leveled.

Further, the bump leveling method claimed in another embodiment for leveling bumps formed on the electrode of an IC chip for a flip chip bonding in the bump leveling apparatus comprises the steps of: holding the IC chip on a stage; pressing a leveler arranged in an opposed position to and in parallel with the stage through the IC chip; and maintaining a pressing force to a prescribed pressing force under which a plurality of bumps are simultaneously leveled to a prescribed height.

The bump leveling method claimed in another embodiment for leveling bumps formed on the electrode of an IC chip for a flip chip bonding in the bump leveling apparatus comprises the steps of: measuring the height of the upper surface of the IC chip while the IC chip is held on a stage; pressing on a leveler arranged in an opposed position to and in parallel with the stage through the IC chip; and stopping the pressing operation when the leveler comes to a position higher by the overall height of the bump than the measured height of the upper surface of the IC chip.

The bump leveling method claimed in another embodiment further comprises a step of automatically inspecting the height of the bump, the leveled diameter, the pedestal diameter and the amount of positional deviation of the bump as inspection items after leveling the bumps according to a previous embodiment.

According to the constitution of the apparatus described, the pressing force under which one bump is deformed to the prescribed height is measured, so that the prescribed pressing force for simultaneously leveling a plurality of bumps to the prescribed height can be set, and while a state in which the prescribed pressing force is applied onto the leveler is kept, the bumps can be leveled to the prescribed height.

Further, according to the constitution of the apparatus described, the height of the upper surface of the IC chip is previously measured and the leveler is stopped an held at a position higher by the overall height of the bump than the upper surface of the IC chip, so that the bumps can be leveled to the prescribed height.

As apparent from the foregoing description, according to the present invention, the pressing force under which one bump is deformed to the prescribed height is previously measured. Therefore, the prescribed pressing force under which a plurality of bumps are deformed and leveled to the prescribed height at the same time can be set and the bumps can be leveled to the prescribed height while a state in which the prescribed pressing force is exerted on the leveler 6 is kept.

Still further, according to the present invention, since the height of the upper surface of the IC chip is previously measured and the leveler is stopped and held at a position higher by the whole height of the bump than the upper surface of the IC chip, the bumps can be leveled to the prescribed height.

Besides, according to the present invention, the height of the upper surface of the IC chip and the difference in height between the respective parts of each of the bumps can be measured and the dimensions and positions of the respective parts of each of the bumps can be automatically inspected after the bumps are all leveled.

Accordingly, according to the present invention, even when the thickness of the chips changes depending on the spaces between the lots of the IC chips or various kinds thereof, the overall height of the bump can be changed so as to meet the thickness of the IC chips and the forms of the leveled bumps can automatically undergo a 100% inspection.

BRIEF DESCRIPTION OF THE DRAWINGS

The present invention will now be described by way of example, with reference to the accompanying drawings, in which.

DESCRIPTION OF THE PREFERRED EMBODIMENT

Figure 1:
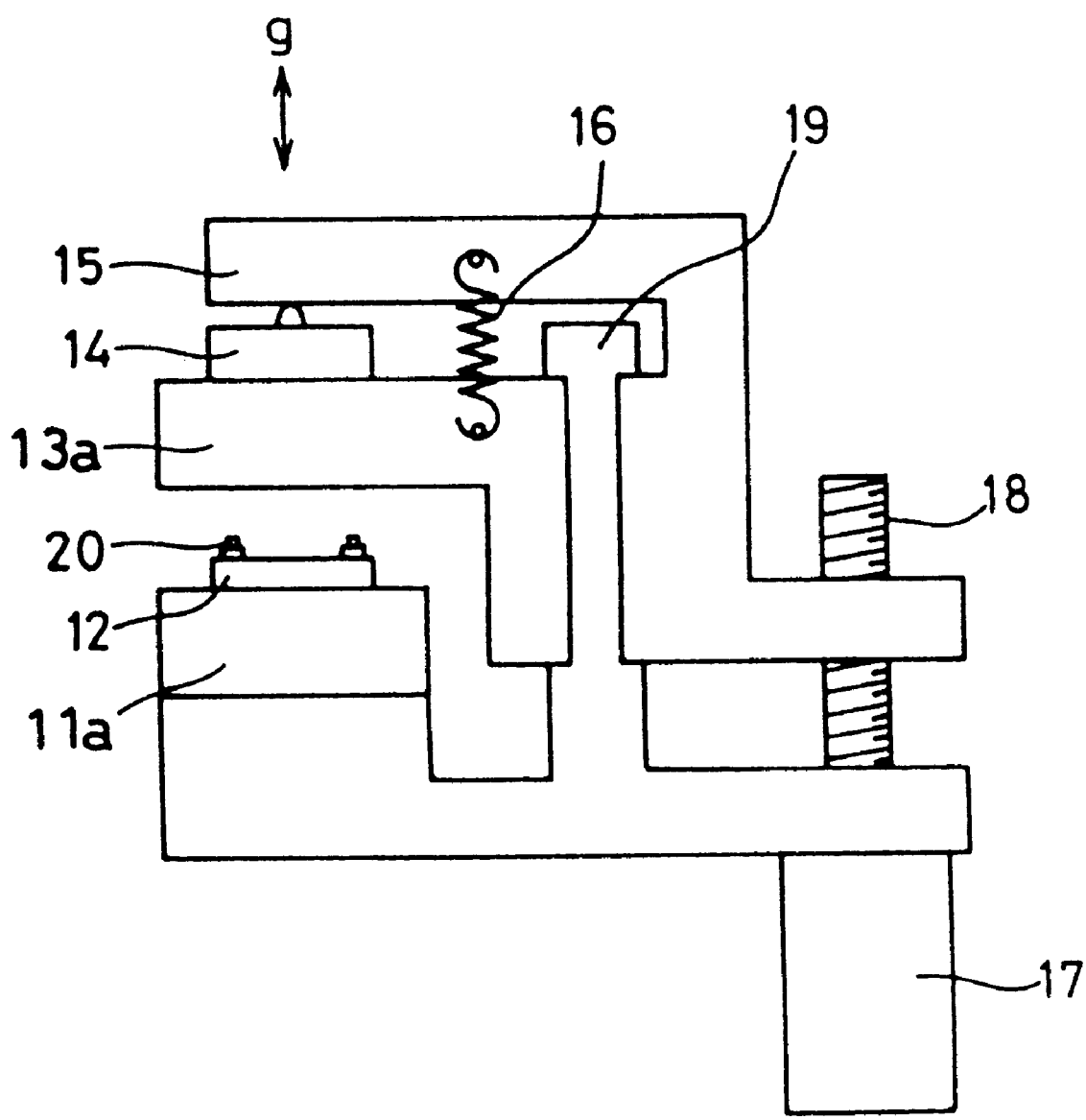
FIG. 1 is a schematic structural diagram of a bump leveling apparatus according to a first embodiment of the present invention.

Referring to the drawings, a detailed explanation will be given for a bump leveling method and a bump leveling apparatus showing embodiments of the present invention, hereinafter.

First Embodiment

FIG. 1 is a schematic structural diagram of a bump leveling apparatus employing a bump leveling method according to the first embodiment of the present invention. In FIG. 1, stage 11a holds IC chip 12, leveler 13a arranged in parallel with the stage 11a and a load cell 14 serves as a pressure detecting means. The load cell 14 is provided between the leveler 13a and an arm 15 serving as a pressing means for applying a pressing force to the leveler 13a. The load cell 14 is sandwiched between the leveler 13a and the pressing arm 15 under a prescribed force by means of a spring 16. The pressure applying arm 15 receives a thrust when a ball screw 18 is rotated by a motor 17 and moves along a guide 19 in the direction shown by an arrow g.

The operation of the bump leveling apparatus constructed as mentioned above will be descried hereinbelow.

As the ball screw 18 is rotated by the motor 17, the pressing or pressure applying arm 15, the load cell 14 and the leveler 13a are moved along the guide 19 toward the IC chip 12 located below them. When the leveler 13a collides with bumps 20 formed on the IC chip 12, a reaction force applied to the leveler 13a is transmitted to the load cell 14. The pressing or pressure applying arm 15 is continuously lowered until the load cell 14 detects a prescribed pressing force. The pressure applying arm 15 stops its lowering operation as soon as the load cell 14 detects the prescribed pressing force and maintains this state. After the pressing arm 15 stops its movement for several seconds, the arm 15 is elevated.

In such a way, the bumps are leveled to a prescribed height. Since the load cell 14 for detecting the pressing force of the pressure applying arm 15 applied to the leveler 13a is provided in accordance with the above-described operation, the prescribed force can be exerted on the bumps 20 so that the plurality of bumps 20 can be simultaneously leveled to the same prescribed height.

As a result, even when the thickness of the chips changes depending on the spaces between the lots of the IC chips or various kinds thereof, the whole height of each of the bumps can be properly varied so as to meet the thickness of the IC chips.

Second Embodiment

Now, an explanation will be given to a bump leveling method and a bump leveling apparatus according to a second embodiment of the present invention.

Figure 2:
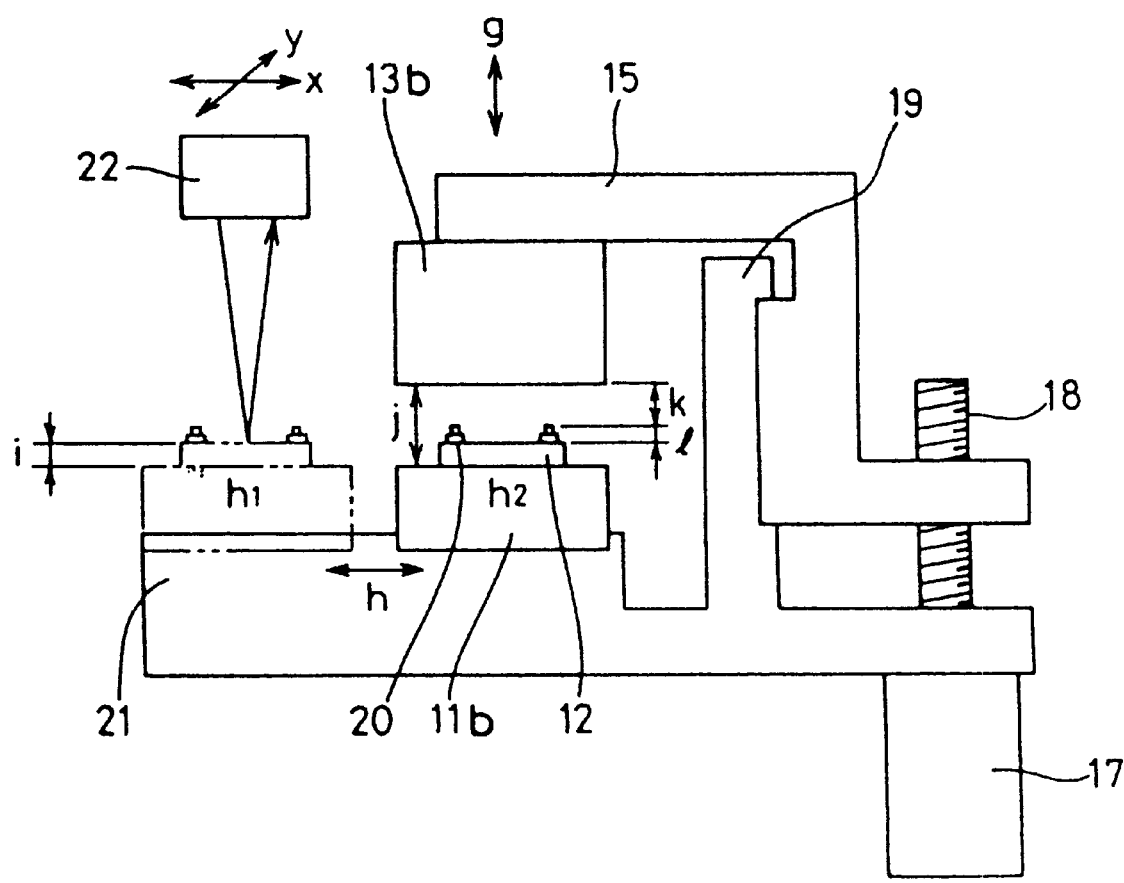
FIG. 2 is a schematic structural diagram of a bump leveling apparatus according to a second embodiment of the present invention.
Figure 3A:
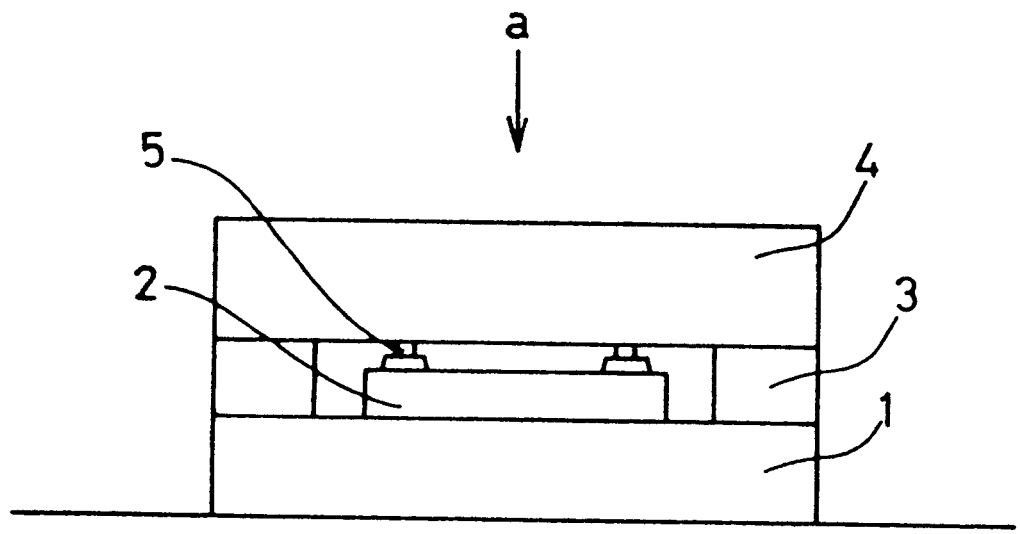
FIG. 3A is a schematic structural diagram of a conventional bump leveling apparatus.
Figure 3B:
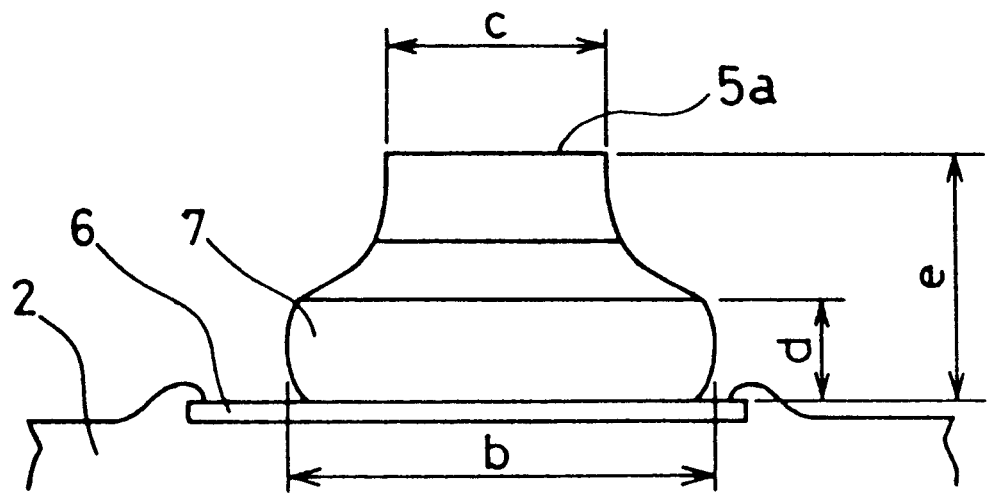
FIG. 3B is an explanatory view of the form of a leveled bump.

FIG. 2 is a schematic structural diagram of a bump leveling apparatus using a bump leveling method according to a second embodiment of the present invention. FIG. 2 is different from FIG. 1 in view of following points that a leveler 13b is fixed to a pressing or pressure applying arm 15 and a stage 11b can be moved along a stage guide 21 in the direction shown by arrow h to a position just below a height measuring means 22. The constitutions of a motor 17, a ball screw 18 and a guide 19 are similar to those of FIG. 1.

The operation of the bump leveling apparatus constructed as mentioned above will be described.

When the stage 11b is located at a position of h1, the thickness i of an IC chip 12 is measured by the height measuring means 22. When the stage 11b is located at a position of h2, a distance j between the upper surface of the stage 11b and the lower surface of the leveler 13b is previously measured and set to a prescribed value. The overall height 1 of each of bumps 20 is obtained after the bumps are leveled from the following expression:

$$1 = j - i - k$$

When the stage 11b is moved to the position of h2 and the leveler 13b is moved by a distance k under the feed of the ball screw 18, the overall height of the bumps 20 can reach a dimension 1. Further, the height measuring means 22 may be designed to measure and inspect the pedestal diameter b, the leveled diameter c, the pedestal thickness d and the overall height e of each of the bumps 20 and the positions of the bumps 20, while the height measuring means 22 is moved in the directions shown by arrows x and y on a plane relatively to the IC chip 12, when the stage b1 is returned to the position of h1 after the bumps are all leveled.

As stated above, since the height of the upper surface of the IC chop 12 is previously measured by the height measuring means 22, the leveler 13b can be lowered to the prescribed height so that the bumps 20 can be leveled to the prescribed height. Additionally, the dimensions of the forms and the positions of the bumps 20 can be automatically inspected by the height measuring means 22 after the bumps are completely leveled.

Although, in the bump leveling apparatus according to the first embodiment of the invention, the pressure of the pressure applying arm 15 is designed to be exerted onto the leveler 13a by using the thrust of the ball screw 18, it is to be understood that the thrust of a cylinder may be employed in place of the thrust of the ball screw 18.

Further, although, in the bump leveling apparatus according to the second embodiment of the invention, the forms and positions of the bumps 20 are examined by using the height measuring means 22, it is to be noted that dimensions in the directions of x and y on the plane may be obtained by employing a measuring means having a camera or the like.

Furthermore, it is to be recognized that the bump leveling apparatus according to the above-described embodiments of the invention may be installed in a bump bonding device for forming bumps, IC ships 12 as shown in FIG. 2, on which the bumps are formed may be moved to the stage 11a or the stage 11b, and then, the bumps may be leveled. Thus, the formation, leveling and inspection of the bumps can be carried out at the same time.

We claim:

1. A bump leveling apparatus for leveling a plurality of bumps formed on an electrode of an IC chip for flip chip bonding, said bump leveling apparatus comprising:
   a stage for holding the IC chip;
   a leveler having a lower surface opposed to an upper surface of said stage so as to form a jaw;
   means for pressing a force to said leveler, the pressing force being perpendicular to the upper surface of said stage; and
   detection means to detect the pressing force applied to the leveler so that said means for pressing maintains a predetermined rate so that said plurality of bumps are simultaneously leveled to a prescribed height.

2. A bump leveling apparatus according to claim 1, wherein said means for pressing includes an arm located having a lower surface that is parallel to an upper surface of said leveler, said arm being biased toward said leveler, said detection means comprises a pressure detecting member, said pressure detecting member disposed between said means for pressing and said leveler, so as to detect the value of pressure by said means for pressing.

3. A bump leveling apparatus according to claim 1, further comprising a height measuring member for inspecting: 1) a height, 2) a leveled diameter, 3) a pedestal diameters and 4) an amount of positional deviation of the bump, wherein said height measuring member automatically inspects said inspection items after the bumps are leveled.

4. A bump leveling apparatus for leveling a plurality of bumps formed on an electrode of an IC chip for flip chip bonding, said bump leveling apparatus comprising:
   a stage for holding the IC chip;
   a leveler having a lower surface opposed to an upper surface of said stage;
   means for pressing a force in a direction perpendicular to the upper surface of said stage and;

detection means to detect when said leveler reaches a position of a prescribed overall height of the bump, as measured from the upper surface of the IC chip, so that said means for pressing stops.

5. A bump leveling apparatus according to claim 4, wherein said detection means comprises a height measuring member for measuring the height of the upper surface of the IC chip, so that said means for pressing stops when the leveler reaches a position of, as measured from the upper surface of said stage, said prescribed overall height of both the bump and the measured value of the height of the upper surface of the IC chip.

6. A bump leveling apparatus according to claim 5, wherein said height measuring member automatically inspects a height, a leveled diameter, a pedestal diameter and an amount of positional deviation of the bump after the bumps have been leveled.

7. A bump leveling method for leveling bumps formed on an electrode of an IC chip for flip chip bonding by a bump leveling apparatus, said bump leveling method comprising the steps of:

holding the IC chip on a stage;

pressing a leveler arranged as a jaw with said stage toward said stage holding the IC chip;

detecting a pressing force on said leveler; and maintaining a force under which a plurality of bumps are simultaneously leveled to a prescribed height by adjusting the detected pressing force.

8. A bump leveling method according to claim 7, further comprising a step of automatically inspecting 1) a height, 2) a leveled diameter, 3) a pedestal diameter and 4) an amount of positional deviation of the bump as inspection items after the bumps are leveled.

9. A bump leveling method for leveling bumps formed on the electrode of an IC chip for flip chip bonding in a bump leveling apparatus, said bump leveling method comprising the steps of:

holding the IC chip on a stage;

measuring a height of an upper surface of the IC chip while the IC chip is held on said stage;

pressing a leveler toward said stage, said leveler being arranged as a jaw with said stage holding the IC chip; and stopping the pressing of said leveler when said leveler reaches a position of, as measured from an upper surface of said stage, a prescribed overall height of both the bump and the measured height of the upper surface of the IC chip.

* * * * *